United States Patent
Sano et al.

(10) Patent No.: US 9,245,745 B2
(45) Date of Patent: Jan. 26, 2016

(54) METHOD OF MANUFACTURING SEMICONDUCTOR DEVICE, METHOD OF PROCESSING SUBSTRATE, SUBSTRATE PROCESSING APPARATUS AND NON-TRANSITORY COMPUTER-READABLE RECORDING MEDIUM

(71) Applicant: HITACHI KOKUSAI ELECTRIC INC., Tokyo (JP)

(72) Inventors: Atsushi Sano, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 3 days.

(21) Appl. No.: 13/796,258

(22) Filed: Mar. 12, 2013

(65) Prior Publication Data
US 2013/0273747 A1    Oct. 17, 2013

(30) Foreign Application Priority Data
Apr. 12, 2012    (JP) .................................. 2012-91336

(51) Int. Cl.
| H01L 21/20 | (2006.01) |
| H01L 21/02 | (2006.01) |
| C23C 16/24 | (2006.01) |
| C23C 16/455 | (2006.01) |
| C23C 16/44 | (2006.01) |

(52) U.S. Cl.
CPC ............ H01L 21/0228 (2013.01); C23C 16/24 (2013.01); C23C 16/45553 (2013.01); C23C 16/4412 (2013.01); C23C 16/45578 (2013.01)

(58) Field of Classification Search
CPC ....................................................... C23C 16/52
See application file for complete search history.

(56) References Cited

U.S. PATENT DOCUMENTS

| 2007/0148350 A1 * | 6/2007 | Rahtu et al. .............. 427/249.17 |
| 2010/0105192 A1 | 4/2010 | Akae et al. |
| 2013/0202794 A1 * | 8/2013 | Dussarrat et al. ............. 427/252 |

FOREIGN PATENT DOCUMENTS

| JP | 2006-024668 A | 1/2006 |
| JP | 2010-153776 A | 7/2010 |
| WO | 2011/123792 A2 | 4/2011 |

* cited by examiner

Primary Examiner — Zandra Smith
Assistant Examiner — Andre' C Stevenson
(74) Attorney, Agent, or Firm — Volpe and Koenig, P.C.

(57) ABSTRACT

A method of manufacturing a semiconductor device, includes: forming a film containing a predetermined element on a substrate by performing a cycle a predetermined number of times, the cycle including: supplying a first precursor containing the predetermined element and a halogen group to the substrate; supplying a second precursor containing the predetermined element and an amino group to the substrate; and supplying a reducing agent not containing halogen, nitrogen and carbon to the substrate.

11 Claims, 7 Drawing Sheets

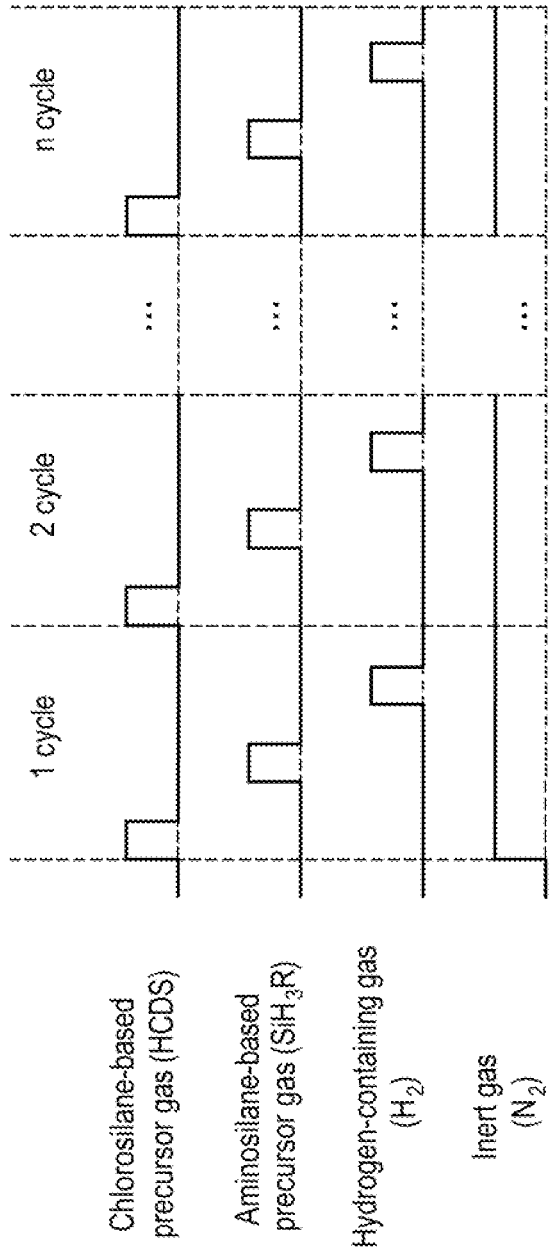

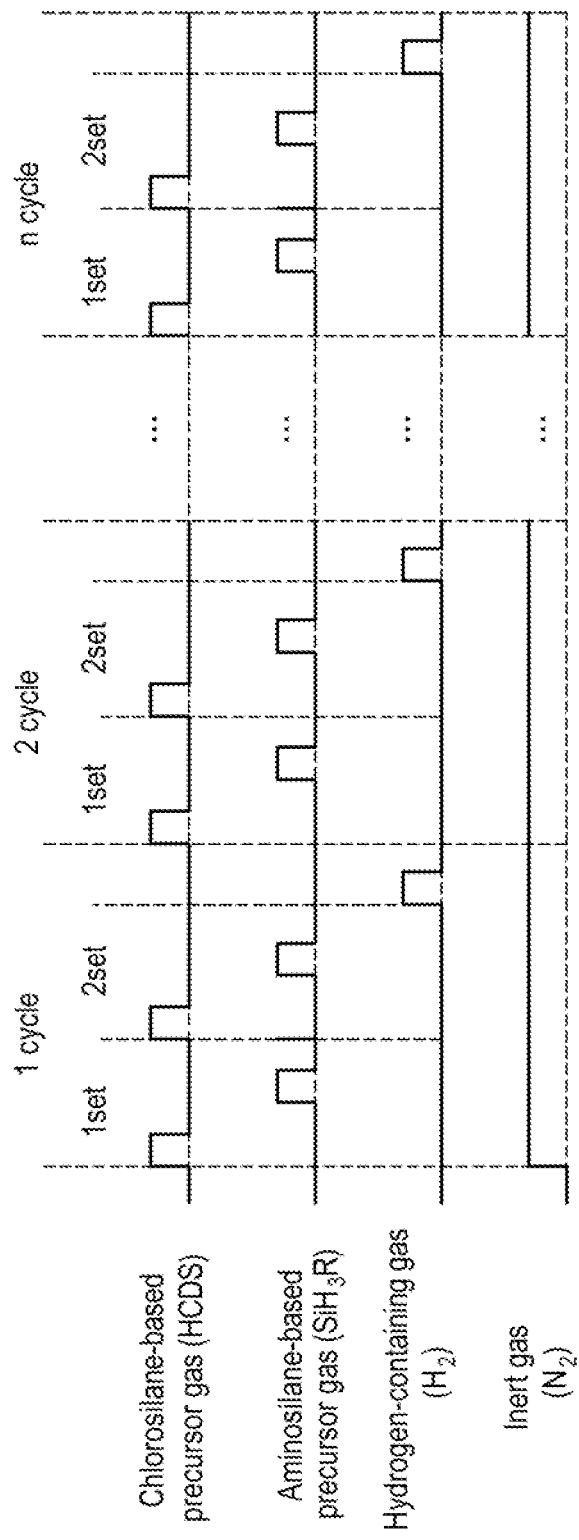

METHOD OF MANUFACTURING SEMICONDUCTOR DEVICE, METHOD OF PROCESSING SUBSTRATE, SUBSTRATE PROCESSING APPARATUS AND NON-TRANSITORY COMPUTER-READABLE RECORDING MEDIUM

CROSS-REFERENCE TO RELATED APPLICATION

This application is based upon and claims the benefit of priority from Japanese Patent Application No. 2012-091336, filed on Apr. 12, 2012, the entire content of which is incorporated herein by reference.

TECHNICAL FIELD

The present disclosure relates to a method of manufacturing a semiconductor device, including a process of forming a film on a substrate, a method of processing a substrate, a substrate processing apparatus, and a non-transitory computer-readable recording medium for storing instructions for executing such methods.

BACKGROUND

In some cases, a process of forming a film such as a silicon oxide (SiO) film or a silicon nitride (SiN) film containing a certain element, for example, silicon (Si), on a substrate may be performed during manufacture of semiconductor devices. A SiO film is widely used as an insulating film or an interlayer because of its high insulating property and low dielectric property. A SiN film is widely used as an insulating film, a mask film, a charge storing film or a stress control film because of its high insulating property, high corrosion resistance, low dielectric property and high film stress controllability. There have also been known techniques for forming a film such as a silicon carbonitride (SiCN) film, a silicon oxycarbonitride (SiOCN) film or a silicon oxycarbide (SiOC) film by adding carbon (C) to the SiO film or the SiN film. Such carbon addition allows for improvement to etching resistance of the film to hydrogen fluoride (HF). In addition, this carbon addition allows for a change in a dielectric constant and a refractive index of the film, and a carbon-added film can be used as an optical functional film or the like having a refractive index different from those of adjacent films.

In recent years, a need to lower a temperature at which a film is formed has increased with miniaturization and diversification of semiconductor devices. Studies on lowering of the film forming temperature have been actively made but conventional efforts have not been sufficiently successful. For example, it was difficult to form a silicon (Si) film using a monosilane ($SiH_4$) gas or a disilane ($Si_2H_6$) gas at a range of low temperatures less than 500 degrees C.

In terms of wet etching resistance to HF, a SiN film and a SiCN film are superior to a SiO film and inferior to a Si film. In other words, the Si film is significantly different from the SiO film and the like in terms of processability (for example, wet etching resistance and so on), and is suitably used as a processing film used to process SiO film and the like (for example, a film for etching a mask used to etch an underlying SiO film and the like using HF). Thus, it is difficult to form a film which is significantly different in processability from the SiO film and the like at a range of low temperatures. Accordingly, if a film containing for example a Si, can be formed at a range of low temperatures, choices for processing film and the processing method may be expanded.

SUMMARY

The present disclosure provides some embodiments of a semiconductor device manufacturing method, a substrate processing method, a substrate processing apparatus and a computer-readable recording medium for storing instructions thereon for executing such methods, which are capable of forming a film containing a certain element, such as silicon (Si), at a range of low temperatures.

According to some embodiments, there is provided a method of manufacturing a semiconductor device, including: forming a film containing a predetermined element on a substrate in a process chamber by performing a cycle a predetermined number of times, the cycle including: supplying a first precursor containing the predetermined element and a halogen group to the substrate; supplying a second precursor containing the predetermined element and an amino group to the substrate; and supplying a reducing agent not containing halogen, nitrogen and carbon to the substrate.

According to some other embodiments, there is provided is a method of processing a substrate, including: forming a film containing a predetermined element on a substrate in a process chamber by performing a cycle a predetermined number of times, the cycle including: supplying a first precursor containing the predetermined element and a halogen group to the substrate; supplying a second precursor containing the predetermined element and an amino group to the substrate; and supplying a reducing agent not containing halogen, nitrogen and carbon to the substrate.

According to yet other embodiments, there is provided a substrate processing apparatus including: a process chamber configured to accommodate a substrate; a first precursor supply system configured to supply a first precursor containing a predetermined element and a halogen group to the substrate in the process chamber; a second precursor supply system configured to supply a second precursor containing the predetermined element and an amino group to the substrate in the process chamber; a reducing agent supply system configured to supply a reducing agent not containing halogen, nitrogen and carbon to the substrate in the process chamber; and a controller configured to control the first precursor supply system, the second precursor supply system and the reducing agent supply system configured to form a film containing the predetermined element on the substrate in the process chamber by performing a cycle a predetermined number of times, the cycle including: supplying the first precursor to the substrate; supplying the second precursor to the substrate; and supplying the reducing agent to the substrate.

According to yet other embodiments, there is provided a non-transitory computer-readable recording medium storing a program that causes a computer to perform a method including: forming a film containing a predetermined element on a substrate in a process chamber by performing a cycle a predetermined number of times, the cycle including: supplying a first precursor containing the predetermined element and a halogen group to the substrate; supplying a second precursor containing the predetermined element and an amino group to the substrate; and supplying a reducing agent not containing halogen, nitrogen and carbon to the substrate.

BRIEF DESCRIPTION OF THE DRAWINGS

FIG. 6 is a timing diagram illustrating timing of gas being supplied in the first sequence, according to some embodiments.

FIG. 7 is a timing diagram illustrating timing of gas being supplied in the second sequence, according to some embodiments.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Figure 1:
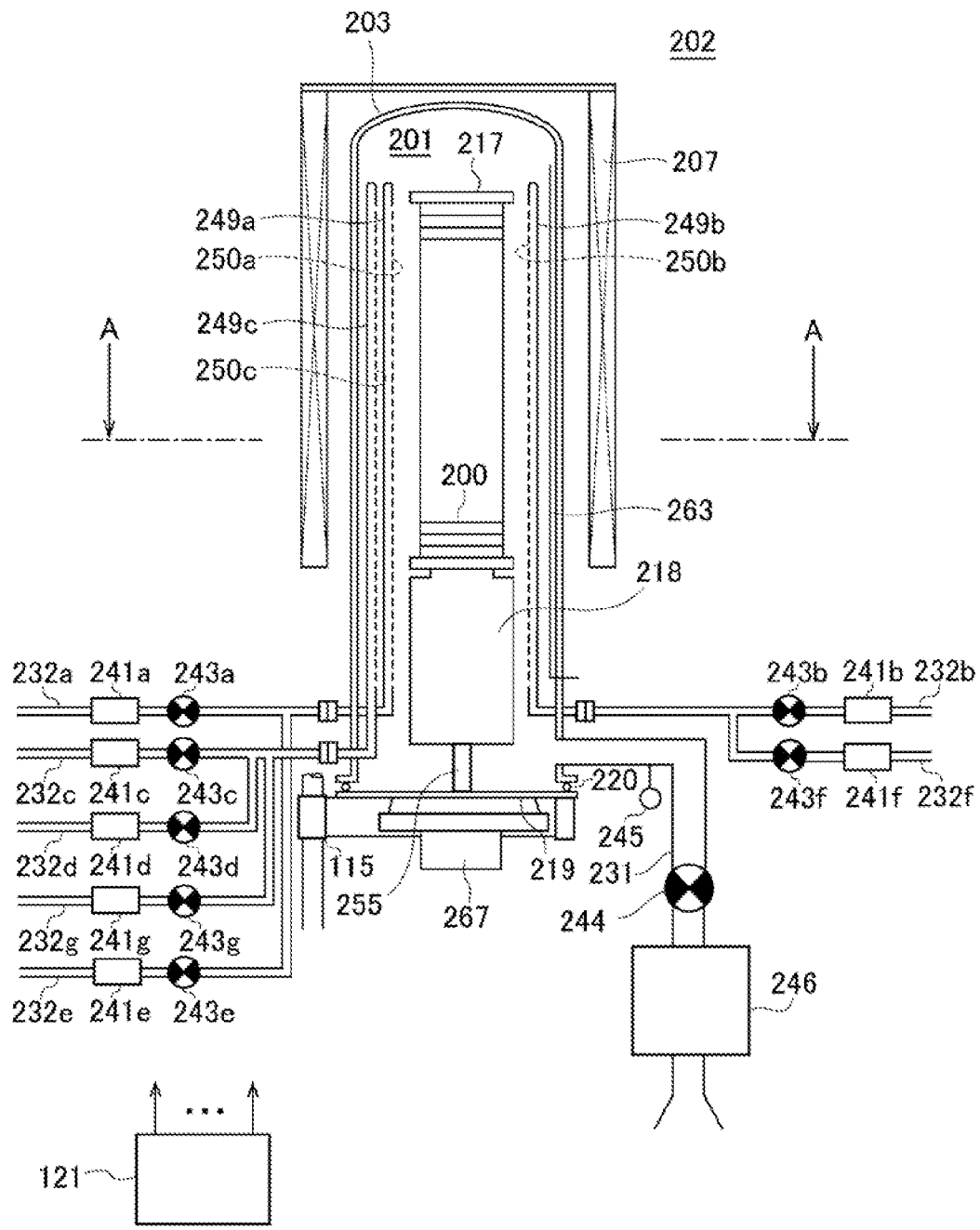
FIG. 1 is a schematic view illustrating a configuration of a vertical treatment furnace of a substrate processing apparatus, in which a portion of the treatment furnace is shown by a longitudinal sectional view, according to some embodiments.
Figure 2:
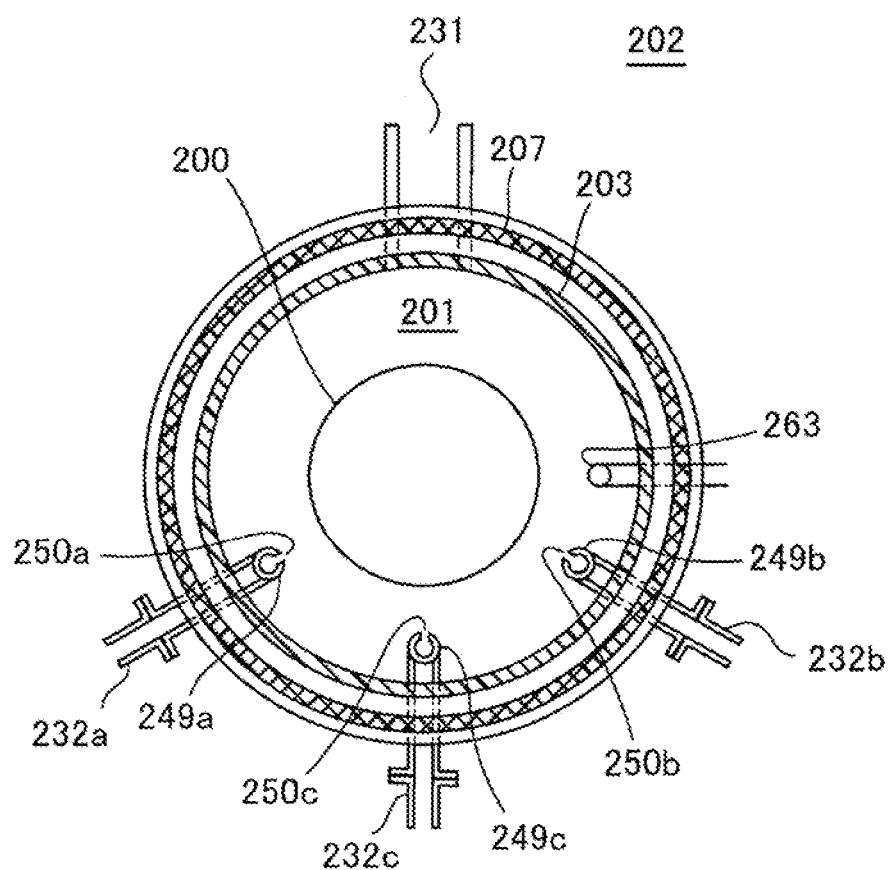
FIG. 2 is a schematic view illustrating a configuration of the vertical treatment furnace of the substrate processing apparatus, in which a portion of the treatment furnace is shown by a sectional view taken along line A-A in FIG. 1.

Various embodiments will be now described with reference to the drawings.
<Embodiments>
(1) Configuration of Substrate Processing Apparatus FIG. 1 is a schematic view illustrating a configuration of a vertical treatment furnace 202 of a substrate processing apparatus, according to some embodiments, in which a portion of the treatment furnace is shown by a longitudinal sectional view. FIG. 2 is a schematic view illustrating a configuration of the vertical treatment furnace 202 of the substrate processing apparatus, according to some embodiments, in which a portion of the treatment furnace is shown by a sectional view taken along line A-A in FIG. 1.

As shown in FIG. 1, the vertical treatment furnace 202 has a heater 207 as a heating member (heating mechanism). The heater 207 has a cylindrical shape and is supported by a heater base (not shown) as a support plate so as to be vertically arranged. The heater 207 acts as an activation mechanism to activate a gas with heat, as will be described later.

A reaction tube 203 forming a reaction vessel (process vessel) is disposed inside the heater 207 in a concentric form along the heater 207. The reaction tube 203 is made of a heat resistant material such as, for example, quartz ($SiO_2$), silicon carbide (SiC) or the like and has a cylindrical shape with its upper end closed and its lower end opened. A process chamber 201 is formed in a hollow of the reaction tube 203 and is configured to accommodate wafers 200. The wafers 200 are horizontally stacked in multiple stages to be aligned in a vertical direction in a boat 217 which will be described later.

A first nozzle 249a, a second nozzle 249b and a third nozzle 249c are disposed to penetrate through a lower side of the reaction tube 203 in the process chamber 201. The first nozzle 249a, the second nozzle 249b and the third nozzle 249c are respectively connected to a first gas supply pipe 232a, a second gas supply pipe 232b and a third gas supply pipe 232c. Additionally, a fourth gas supply pipe 232d is connected to the third gas supply pipe 232c. In this way, the three nozzles 249a, 249b and 249c and the four gas supply pipes 232a, 232b, 232c and 232d are provided in the reaction tube 203 to allow several kinds of (4 in this example) gases to be supplied into the process chamber 201.

An exhaust pipe 231 is disposed at a lower portion of the reaction tube 203. In addition, a metal manifold (not shown) to support the reaction tube 203 may be disposed below the reaction tube 203 and the nozzles 249a, 249b and 249c may be disposed to penetrate through a side wall of the metal manifold. In this case, the exhaust pipe 231 may be disposed at the metal manifold, rather than the lower portion of the reaction tube 203.

A mass flow controller (MFC) 241a as a flow rate controller (a flow rate control unit) and an opening/closing valve 243a are disposed in the first gas supply pipe 232a in this order from the upstream direction. In addition, a first inert gas supply pipe 232e is connected to the downstream side of the valve 243a of the first gas supply pipe 232a. A mass flow controller (MFC) 241e as a flow rate controller (a flow rate control unit) and an opening/closing valve 243e are disposed in the first inert gas supply pipe 232e in this order from the upstream direction. In addition, the above-mentioned first nozzle 249a is connected to a leading end of the first gas supply pipe 232a. The first nozzle 249a is vertically disposed along an inner wall of the reaction tube 203 in a circular arc-shaped space between the inner wall of the reaction tube 203 and the wafers 200. The first nozzle 249a is disposed in a flank of a wafer arrangement region where the wafers 200 are arranged. The first nozzle 249a is configured as an L-like long nozzle and has its horizontal portion disposed to penetrate through the lower side wall of the reaction tube 203 and its vertical portion disposed to rise from at least one end of the wafer arrangement region toward a other end thereof. A plurality of gas supply holes 250a through which gas is supplied is disposed at a side surface of the first nozzle 249a. The gas supply holes 250a are opened toward the center of the reaction tube 203 so that gas can be supplied toward the wafers 200. The gas supply holes 250a are disposed to span from the bottom to top of the reaction tube 203 at a predetermined opening pitch. Each of the gas supply holes 250a has the same opening area. A first gas supply system is mainly constituted by the first gas supply pipe 232a, the mass flow controller 241a, the valve 243a and the first nozzle 249a. In addition, a first inert gas supply system is mainly constituted by the first inert gas supply pipe 232e, the mass flow controller 241e and the valve 243e.

A mass flow controller (MFC) 241b as a flow rate controller (a flow rate control unit) and an opening/closing valve 243b are disposed in the second gas supply pipe 232b in this order from the upstream direction. In addition, a second inert gas supply pipe 232f is connected to the downstream side of the valve 243b of the second gas supply pipe 232b. A mass flow controller (MFC) 241f as a flow rate controller (a flow rate control unit) and an opening/closing valve 243f are disposed in the second inert gas supply pipe 232f in this order from the upstream direction. In addition, the above-mentioned second nozzle 249b is connected to a leading end of the second gas supply pipe 232b. The second nozzle 249b is vertically disposed along the inner wall of the reaction tube 203 in the circular arc-shaped space between the inner wall of the reaction tube 203 and the wafers 200. The second nozzle 249b is disposed in the flank of the wafer arrangement region where the wafers 200 are arranged. The second nozzle 249b is configured as an L-like long nozzle and has its horizontal portion disposed to penetrate through the lower side wall of the reaction tube 203 and its vertical portion disposed to rise from at least one end of the wafer arrangement region toward the other end thereof. A plurality of gas supply holes 250b through which gas is supplied is disposed at a side surface of the second nozzle 249b. The gas supply holes 250b are opened toward the center of the reaction tube 203 so that gas can be supplied toward the wafers 200. The gas supply holes 250b are disposed to span from the bottom to top of the reaction tube 203 at a predetermined opening pitch. Each of the gas supply holes 250b has the same opening area. A second gas supply system is mainly constituted by the second gas supply pipe 232b, the mass flow controller 241b, the valve 243b and the second nozzle 249b. In addition, a second inert gas supply system is mainly constituted by the second inert gas supply pipe 232f, the mass flow controller 241f and the valve 243f.

A mass flow controller (MFC) 241c as a flow rate controller (a flow rate control unit) and an opening/closing valve 243c are disposed in the third gas supply pipe 232c in this order from the upstream direction. In addition, a fourth gas supply pipe 232d is connected to the downstream side of the valve 243c of the third gas supply pipe 232c. A mass flow controller 241d as a flow rate controller (a flow rate control unit) and an opening/closing valve 243d are disposed in the fourth gas supply pipe 232d in this order from the upstream direction. In addition, a third inert gas supply pipe 232g is connected to the downstream side of a connection position of the third gas supply pipe 232c to the fourth gas supply pipe 232d. A mass flow controller 241g as a flow rate controller (a flow rate control unit) and an opening/closing valve 243g are disposed in the third inert gas supply pipe 232g in this order from the upstream direction. In addition, the above-mentioned third nozzle 249c is connected to a leading end of the third gas supply pipe 232c. The third nozzle 249c is vertically disposed along the inner wall of the reaction tube 203 in the circular arc-shaped space between the inner wall of the reaction tube 203 and the wafers 200. The third nozzle 249c is disposed in the flank of the wafer arrangement region where the wafers 200 are arranged. The third nozzle 249c is configured as an L-like long nozzle and has its horizontal portion disposed to penetrate through the lower side wall of the reaction tube 203 and its vertical portion disposed to rise from at least one end of the wafer arrangement region toward the other end thereof. A plurality of gas supply holes 250c through which gas is supplied is disposed in a side surface of the third nozzle 249c. The gas supply holes 250c are opened toward the center of the reaction tube 203 so that gas can be supplied toward the wafers 200. The gas supply holes 250c are disposed to span from the bottom to top of the reaction tube 203 at a predetermined opening pitch. Each of the gas supply holes 250c has the same opening area. A third gas supply system is mainly constituted by the third gas supply pipe 232c, the mass flow controller 241c, the valve 243c and the third nozzle 249c. In addition, a fourth gas supply system is mainly constituted by the fourth gas supply pipe 232d, the mass flow controller 241d, the valve 243d and the third nozzle 249c. In addition, a third inert gas supply system is mainly constituted by the third inert gas supply pipe 232g, the mass flow controller 241g and the valve 243g.

In the gas supply systems, gas is transferred via the nozzles 249a, 249b and 249c arranged in the circular arc-shaped longitudinal space defined by the inner wall of the reaction tube 203 and ends of the plurality of loaded wafers 200 and supplied into the reaction tube 203 near the wafers 200 from the gas supply holes 250a, 250b and 250c opened in the nozzles 249a, 249b and 249c, respectively. The gas supplied into the reaction tube 203 mainly flows in a horizontal direction, that is, a direction in parallel to the surface of the wafers 200 in the reaction tube 203. This configuration provides an advantage of uniformly supplying the gas to the wafers 200 and forming a uniform thickness of a film on the wafers 200. Although a residual gas after the reaction flows toward the exhaust mechanism, that is, the exhaust pipe 231, a direction of flow of the residual gas is specified by a position of the exhaust mechanism without being limited to the vertical direction.

A first precursor (raw material) gas containing a predetermined element and a halogen group, for example, a chlorosilane-based precursor gas containing at least a silicon (Si) element and a chloro group, is supplied from the first gas supply pipe 232a into the process chamber 201 via the mass flow controller 241a, the valve 243a and the first nozzle 249a. As used herein, the chlorosilane-based precursor gas may refer to a silane-based gas containing a chloro group and contains at least silicon (Si) and chlorine (Cl). In this example, a hexachlorodisilane ($Si_2Cl_6$, or HCDS) gas may be used as the chlorosilane-based precursor gas. When a liquefied precursor such as HCDS in a liquid state at room temperature and atmospheric pressure is used, the liquefied precursor may be supplied as precursor gas (HCDS gas) after being vaporized by a vaporizing system (not shown) such as a vaporizer or a bubbler.

A second precursor gas containing a predetermined element and an amino group (amine group), for example, an aminosilane-based precursor gas containing at least a silicon (Si) element and an amino group, is supplied from the second gas supply pipe 232b into the process chamber 201 via the mass flow controller 241b, the valve 243b and the second nozzle 249b. As used herein, the aminosilane-based precursor may refer to a silane-based precursor containing an amino group (or silane-based precursor containing a methyl group or an ethyl group) and contains at least silicon (Si), nitrogen (N) and carbon (C). An example of the aminosilane-based precursor may include monoaminosilane ($SiH_3R$) containing one amino group in its composition formula (in its one molecule). R represents a ligand. In this example, R is an amino group in which one or two hydrocarbon groups containing one or more carbon elements (C) are coordinated with one nitrogen element (N) (i.e., one or both of hydrogen elements (H) of an amino group represented by $NH_2$ are substituted by a hydrocarbon group containing one or more carbon elements (C)). If two hydrocarbon groups constituting a portion of the amino group are coordinated with one nitrogen element (N), the two hydrocarbon groups may be the same or different from each other. In addition, the hydrocarbon groups may include an unsaturated bond such as a double bond or a triple bond. In addition, the amino group may have a ring structure. Examples of $SiH_3R$ may include (ethylmethylamino)silane ($SiH_3[N(CH_3)(C_2H_5)]$), (dimethylamino)silane ($SiH_3[N(CH_3)_2]$), (diethylpiperidino.silane ($SiH_3[NC_5H_8)(C_2H_5)_2]$) and the like. When a liquefied precursor such as $SiH_3R$ in a liquid state at room temperature and atmospheric pressure is used, the liquefied precursor may be supplied as precursor gas ($SiH_3R$ gas) after being vaporized by a vaporizing system (not shown) such as a vaporizer or a bubbler.

A hydrogen-containing gas (H-containing gas) such as a reducing agent which contains no halogen, nitrogen (N) and carbon (C) is supplied from the third gas supply pipe 232c into the process chamber 201 via the mass flow controller 241c, the valve 243c and the third nozzle 249c. In this example, an example of the H-containing gas may include a hydrogen gas ($H_2$ gas) which is a reducing agent which contains no Cl, N and C.

A hydrogen-containing gas (H-containing gas) such as a reducing agent which contains no halogen, nitrogen (N) and carbon (C) is supplied from the fourth gas supply pipe 232*d* into the process chamber 201 via the mass flow controller 241*d*, the valve 243*d*, the third gas supply pipe 232*c* and the third nozzle 249*c*. Examples of the H-containing gas may include a monosilane ($SiH_4$) gas, a disilane ($Si_2H_4$) gas and a trisilane ($Si_3H_8$) gas, all of which are a reducing agent which contains no Cl, N and C.

A nitrogen gas ($N_2$ gas) is supplied from the inert gas supply pipes 232*e*, 232*f* and 232*g* into the process chamber 201 via the mass flow controllers 241*e*, 241*f* and 241*g*, the valves 243*e*, 243*f* and 243*g*, the gas supply pipes 232*a*, 232*b*, and 232*c* and the nozzles 249*a*, 249*b* and 249*c*, respectively.

For example, when the gases are flown from the gas supply pipes as described above, a first precursor gas supply system supplying the first precursor containing the predetermined element and the halogen group, i.e., a chlorosilane-based precursor gas supply system, is constituted by the first gas supply system. In addition, a second precursor gas supply system supplying the second precursor containing the predetermined element and the amino group, i.e., an aminosilane-based precursor gas supply system, is constituted by the second gas supply system. The chlorosilane-based precursor gas supply system and the aminosilane-based precursor gas supply system may be sometimes abbreviated as a chlorosilane-based precursor supply system and an aminosilane-based precursor supply system, respectively. In addition, a hydrogen-containing gas supply system, i.e., a reducing agent supply system, is constituted by the third gas supply system. In addition, a hydrogen-containing gas supply system, i.e., a reducing agent supply system, is constituted by the fourth gas supply system. When the hydrogen-containing gas is referred to as reaction gas, a reaction gas supply system is constituted by the hydrogen-containing gas supply system.

The exhaust pipe 231 to exhaust the internal atmosphere of the process chamber 201 is disposed in the reaction tube 203. As shown in FIG. 2, when viewed from a cross section (along line A-A in FIG. 1), the exhaust pipe 231 is disposed in a position opposite to a position where the gas supply holes 250*a* of the first nozzle 249*a*, the gas supply holes 250*b* of the second nozzle 249*b* and the gas supply holes 250*c* of the third nozzle 249*c* of the reaction tube 203 are disposed, that is, a position opposite to the gas supply holes 250*a*, 250*b* and 250*c* with the wafers 200 interposed therebetween. In addition, as shown in FIG. 1, when viewed from a longitudinal section, the exhaust pipe 231 is disposed below a position where the gas supply holes 250*a*, 250*b* and 250*c* are disposed. With this configuration, gas supplied from the gas supply holes 250*a*, 250*b* and 250*c* to the neighborhood of the wafers 200 in the process chamber 201 flows in a horizontal direction, that is, a direction in parallel to surfaces of the wafers 200, flows downward, and then is exhausted out of the exhaust pipe 231. The main flow of gas in the process chamber 201 becomes a flow in the horizontal direction, as described previously.

The exhaust pipe 231 is connected with a vacuum pump 246 as a vacuum exhaust device via a pressure sensor 245 (pressure detecting part) for detecting the internal pressure of the process chamber 201 and an APC (Auto Pressure Controller) valve 244 as a pressure regulator (pressure regulating part). An exhaust system is mainly constituted by the exhaust pipe 231, the APC valve 244 and the pressure sensor 245. The vacuum pump 246 may also be included in the exhaust system. The APC valve 244 is a valve configured to perform/stop vacuum exhaust in the process chamber 201 by opening/closing the valve with the vacuum pump 246 actuated and adjust the internal pressure of the process chamber 201 by regulating a degree of the valve opening with the vacuum pump 246 actuated. In other words, the exhaust system is configured to approach the actual internal pressure of the process chamber 201 to a predetermined pressure (a degree of vacuum) by regulating the degree of the valve opening of the APC valve 244 based on pressure information detected by the pressure sensor 245 while actuating the vacuum pump 246.

A seal cap 219, which functions as a furnace opening cover for air-tightly blocking the bottom opening of the reaction tube 203, is disposed below the reaction tube 203. The seal cap 219 is configured to contact the bottom of the reaction tube 203 from below in the vertical direction. The seal cap 219 is made of, for example, metal such as stainless steel or the like and has a disc shape. An O-ring 220 as a seal member contacting the bottom of the reaction tube 203 is disposed in the top side of the seal cap 219. A rotation mechanism 267 to rotate the boat 217, which will be described later, is disposed below the seal cap 219. A shaft 255 of the rotation mechanism 267 is connected to the boat 217 through the seal cap 219. The rotation mechanism 267 is configured to rotate the wafers 200 by rotating the boat 217. The seal cap 219 is configured to be vertically elevated or lowered by a boat elevator 115 as an elevation mechanism vertically disposed outside the reaction tube 203. The boat elevator 115 is configured to carry the boat 217 into or out of the process chamber 201 by elevating or lowering the seal cap 219. That is, the boat elevator 115 is configured as a transfer device (transfer mechanism) to transfer the boat 217, i.e., the wafers 200, into or out of the process chamber 201.

The boat 217, which is utilized as the substrate support, is made of, for example, a heat resistant material such as quartz, silicon carbide or the like and is configured to support the wafers 200 horizontally stacked in multiple stages with the center of the wafers 200 concentrically aligned. In addition, a heat insulating member 218 made of, for example, a heat resistant material such as quartz, silicon carbide or the like is disposed below the boat 217 and is configured to make it difficult for heat from the heater 207 to be transferred to the seal cap 219. The heat insulating member 218 may be constituted by a plurality of heat insulating plates, each made of a heat resistant material such as quartz, silicon carbide or the like, and a heat insulating plate holder to support these heat insulating plates horizontally in multiple stages.

A temperature sensor 263 as a temperature detector is disposed within the reaction tube 203. Based on temperature information detected by the temperature sensor 263, a state of electric conduction to the heater 207 is adjusted such that the interior of the process chamber 201 has an intended temperature distribution. The temperature sensor 263 has an L-like shape, like the nozzles 249*a*, 249*b* and 249*c* and is disposed along the inner wall of the reaction tube 203.

Figure 3:
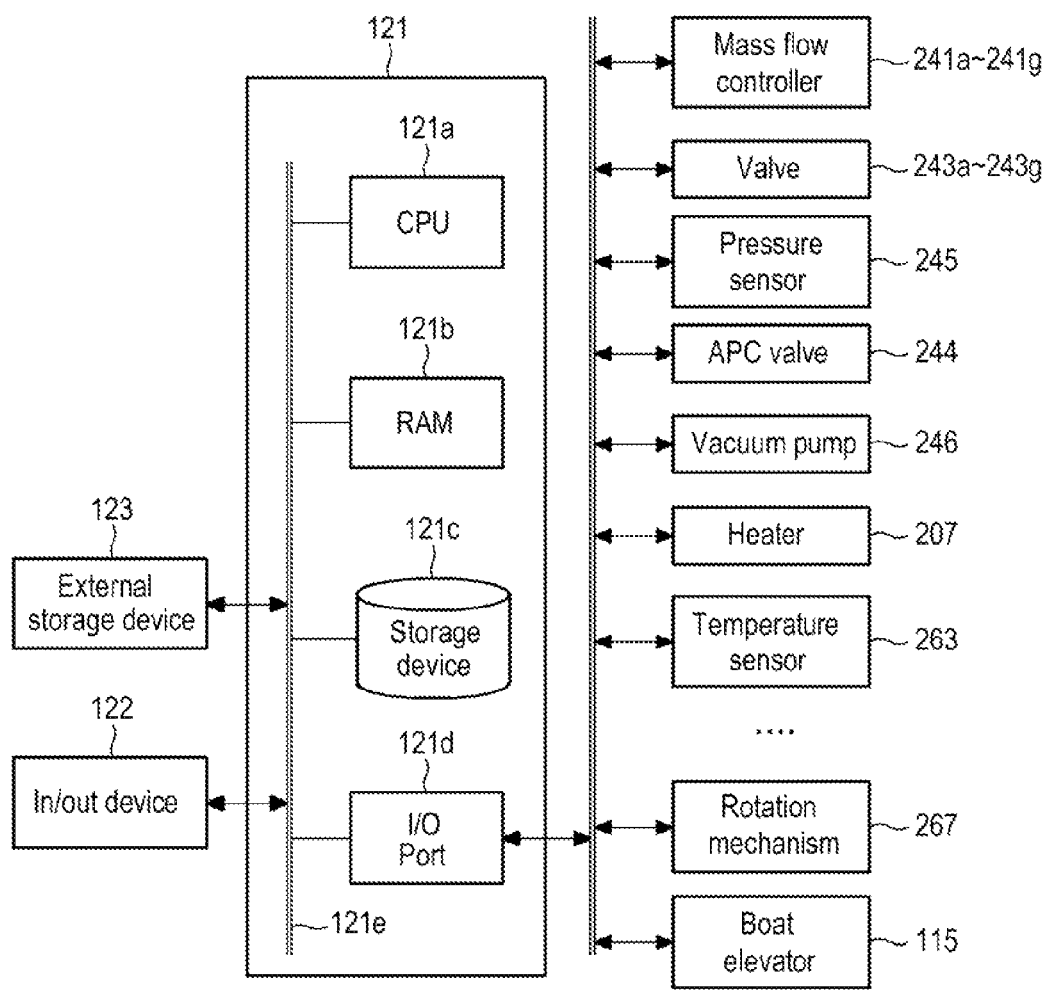
FIG. 3 is a block diagram illustrating a configuration of a controller of the substrate processing apparatus, according to some embodiments.

FIG. 3 is a block diagram illustrating a configuration of a controller of the substrate processing apparatus, according to some embodiments. As shown in FIG. 3, a controller 121 as a control unit (control means) is constituted by a computer including one or more processor(s), such as a CPU (Central Processing Unit) 121*a*, a RAM (Random Access Memory) 121*b*, a storage device 121*c* and an I/O port 121*d*. The RAM 121*b*, the storage device 121*c* and the I/O port 121*d* are configured to exchange data with the CPU 121*a* via an internal bus 121*e*. An input/output device 122 constituted by, for example, a touch panel or the like is connected to the controller 121.

The storage device 121*c* is constituted by, for example, a flash memory, a HDD (Hard Disk Drive) or the like. Control programs to control an operation of the substrate processing apparatus and process recipes describing substrate processing procedures and conditions, which will be described later, are readably stored in the storage device 121c. The process recipes function as programs to cause the controller 121 to execute procedures in substrate processing which will be described later. Hereinafter, these process recipes and control programs are collectively simply referred to as programs. As used herein, the term "programs" may be intended to include process recipes only, control programs only, or both thereof. The RAM 121b is configured as a memory area (work area) in which programs and data read by the CPU 121a are temporarily stored.

The I/O port 121d is connected to the above-mentioned mass flow controllers 241a, 241b, 241c, 241d, 241e, 241f and 241g, valves 243a, 243b, 243c, 243d, 243e, 243f and 243g, pressure sensor 245, APC valve 244, vacuum pump 246, heater 207, temperature sensor 263, rotation mechanism 267, boat elevator 115 and so on.

The CPU 121a is configured to read and execute a control program from the storage device 121c and read a process recipe from the storage device 121c according to an operation command input from the input/output device 122. The CPU 121a is further configured to control a flow rate adjustment operation of various gases by the mass flow controllers 241a, 241b, 241c, 241d, 241e, 241f and 241g, an opening/closing operation of the valves 243a, 243b, 243c, 243d, 243e, 243f and 243g, an opening/closing operation of the APC valve 244, a pressure adjustment operation by the APC valve 244 based on the pressure sensor 245, a temperature adjustment operation of the heater 207 based on the temperature sensor 263, start and stop of the vacuum pump 246, rotation and a rotation speed adjustment operation of the boat 217 by the rotation mechanism 267, an elevation operation by the boat elevator 115, etc., according to contents of the read process recipe.

The controller 121 may be configured as a general-purpose computer without being limited to a dedicated computer. For example, in the embodiment, the controller 121 may be configured to prepare an external storage device (for example, a magnetic tape, a magnetic disk such as a flexible disk or a hard disk, an optical disk such as CD or DVD, a magneto-optical disk such as MO, and a semiconductor memory such as a USB memory or a memory card) 123 which stores the above-described programs, and install the programs from the external storage device 123 into the general-purpose computer. A means for providing access to the programs for the computer is not limited to the case where the programs are accessed through the external storage device 123. For example, the programs may be accessed from a remote location using a communication means such as Internet, a dedicated line or the like, without the external storage device 123. The storage device 121c and the external storage device 123 are implemented with a computer readable recording medium and will be hereinafter collectively simply referred to as a recording medium. The term "recording medium" may include the storage device 121c only, the external storage device 123 only, or both thereof.

(2) Substrate Processing Method

As one of the processes of manufacturing a semiconductor device using the vertical treatment furnace 202 of the above-described substrate processing apparatus, an example of a sequence of forming a film including certain elements on a wafer 200 will be now described. In the following description, operations of various components constituting the substrate processing apparatus are controlled by the controller 121.

In a film forming sequence of this embodiment, a silicon film is formed on the wafer 200, as a film containing a predetermined element, by performing a cycle including a process of supplying a first precursor containing the predetermined element and a halogen group to the wafer 200 in the process chamber 201, supplying a second precursor containing the predetermined element and an amino group to the wafer 200 in the process chamber 201, and supplying a reducing agent not containing halogen, nitrogen and carbon to the wafer 200 in the process chamber 201, by a predetermined number of times.

In forming the silicon film, a cycle including forming a first layer containing an impurity such as halogen, and a predetermined element on the wafer 200 by performing the act of supplying the first precursor and the act of supplying the second precursor alternately by a predetermined number of times, and forming a second layer containing the predetermined element by performing the act of supplying a reducing agent to the first layer to modify the first layer so that the impurity such as halogen contained in the first layer are separated from the first layer is performed by a predetermined number of times.

Here, the phase "performing the act of supplying the first precursor and the act of supplying the second precursor alternately by a predetermined number of times" is intended to include both of performing a set of first supplying one of the first and second precursors and then supplying the other once, and repeating this set several times. That is, this phase means performing this set one or more times (e.g., a predetermined number of times). The case of performing this set once corresponds to a first sequence which will be described later and the case of repeating this set several times corresponds to a second sequence which will be described later.

In addition, the phase "a cycle including forming a first layer and forming a second layer is performed by a predetermined number of times " is intended to include both performing this cycle once and repeating this cycle several times. That is, this phase means performing this cycle once or more (a predetermined number of times).

(First Sequence)

Figure 4:
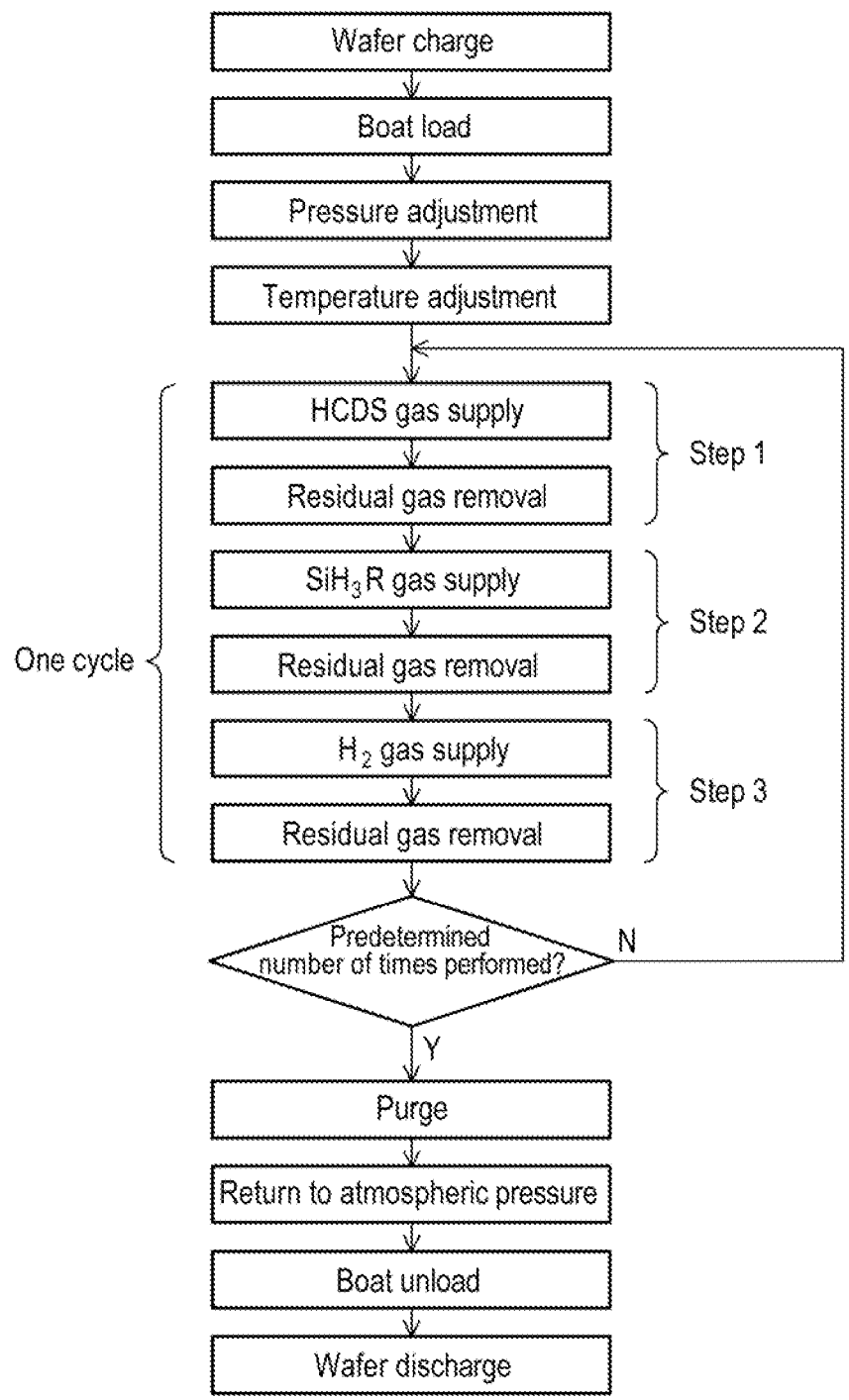
FIG. 4 is a flow chart illustrating film formation in a first sequence, according to some embodiments.

First, a first sequence of this embodiment will be described. FIG. 4 is a flow chart illustrating a flow of film formation in a first sequence of this embodiment. FIG. 6 is a timing diagram illustrating timing of gas being supplied in the first sequence of this embodiment.

In the first sequence of this embodiment, by performing a set of a process of supplying a chlorosilane-based precursor as a first precursor to the wafer 200 in the process chamber 201 and supplying an aminosilane-based precursor as a second precursor to the wafer 200 in the process chamber 201 once, a first layer containing impurities such as silicon, chlorine and the like is formed on the wafer 200. Then, a second layer containing the silicon (silicon layer) is formed by supplying a reducing agent containing no chlorine, nitrogen and carbon to the wafer 200 in the process chamber to modify the first layer so that the impurity such as chlorine contained in the first layer are separated from the first layer. A cycle including the act of forming the first layer and the act of forming the second layer is performed by a predetermined number of times to form a silicon film constituted by silicon alone on the wafer 200.

FIGS. 4 and 6 show an example in which the process of supplying the chlorosilane-based precursor to the wafer 200 in the process chamber 201 and supplying the aminosilane-based precursor are performed to form the first layer, i.e., the chlorosilane-based precursor is supplied earlier than the aminosilane-based precursor.

The second sequence of this embodiment will be described below in more detail. Here, an example of using an HCDS gas as the chlorosilane-based precursor gas, an $SiH_3R$ gas as the aminosilane-based precursor gas, and an $H_2$ gas, which is a hydrogen-containing gas, as the reducing agent and forming the silicon (Si) film on the wafer 200 according to the flow of film formation in FIG. 4 and the film forming sequence in FIG. 6 will be described.

<Wafer Charge and Boat Load>

When a plurality of wafers 200 is loaded on the boat 217 (wafer charge), the boat 217 supporting the plurality of wafers 200 is lifted and loaded into the process chamber 201 by the boat elevator 115 (boat load), as shown in FIG. 1. In this state, the seal cap 219 seals the bottom of the reaction tube 203 via the O-ring 220.

<Pressure Adjustment and Temperature Adjustment>

The interior of the process chamber 201 is vacuum-exhausted by the vacuum pump 246 to set the interior to a desired pressure (degree of vacuum). At this time, the internal pressure of the process chamber 201 is measured by the pressure sensor 245 and the APC valve 244 is feedback-controlled based on the measured pressure information (pressure adjustment). The vacuum pump 246 remains activated at least until the wafers 200 are completely processed. The interior of the process chamber 201 is heated by the heater 207 to set the interior to a desired temperature. At this time, a state of electric conduction to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 continues at least until the wafers 200 are completely processed. Subsequently, the boat 217 and the wafers 200 begin to be rotated by the rotation mechanism 267. The rotation of the boat 217 and the wafers 200 by the rotation mechanism 267 continues at least until the wafers 200 are completely processed.

<Process of Forming Silicon Film >

Thereafter, the following three steps (Steps 1 to 3) are sequentially performed.

<Step 1>
<HCDS Gas Supply>

The valve 243a of the first gas supply pipe 232a is opened to flow the HCDS gas into the first gas supply pipe 232a. A flow rate of the HCDS gas flowing into the first gas supply pipe 232a is regulated by the mass flow controller 241a. The HCDS gas with its flow rate regulated is supplied from the gas supply holes 250a of the first nozzle 249a into the process chamber 201 and is exhausted from the exhaust pipe 231. At this time, the HCDS gas is supplied to the wafers 200. At the same time, the valve 243e is opened to flow an inert gas such as an $N_2$ gas or the like into the first inert gas supply pipe 232e. A flow rate of the $N_2$ gas flowing into the first inert gas supply pipe 232e is regulated by the mass flow controller 241e. The $N_2$ gas with its flow rate regulated is supplied into the process chamber 201, along with the HCDS gas, and is exhausted from the exhaust pipe 231. At this time, in order to prevent the HCDS gas from being introduced into the second nozzle 249b and the third nozzle 249c, the valves 243f and 243g are opened to flow the $N_2$ gas into the second inert gas supply pipe 232f and the third inert gas supply pipe 232g. The $N_2$ gas is supplied into the process chamber 201 via the second gas supply pipe 232b, the third gas supply pipe 232c, the second nozzle 249b and the third nozzle 249c and is exhausted from the exhaust pipe 231.

At this time, the APC valve 244 is appropriately regulated to set the internal pressure of the process chamber 201 to fall within a range of, for example, 1 to 13300 Pa, preferably 20 to 1330 Pa. The flow rate of the HCDS gas controlled by the mass flow controller 241a is set to fall within a range of, for example, 1 to 1000 sccm. The flow rates of the $N_2$ gases controlled by the mass flow controllers 241e, 241f and 241g are set to fall within a range of, for example, 100 to 10000 sccm. Time period during which the HCDS gas is supplied to the wafers 200, that is, gas supply time (irradiation time), is set to fall within a range of, for example, 1 to 120 seconds, preferably 1 to 60 seconds. At this time, the heater 207 is set to a temperature such that the temperature of the wafers 200 is set to fall within a range of, for example, 250 to 700 degrees C., preferably 350 to 650 degrees C. If the temperature of the wafers 200 is less than 250 degrees C., it becomes difficult for HCDS to be chemisorbed onto the wafers 200, which may result in difficulty in obtaining a practical film forming rate. This problem can be overcome by setting the temperature of the wafers 200 to 250 degrees C. or higher. If the temperature of the wafers 200 is set to 350 degrees C. or higher, HCDS can be more sufficiently adsorbed onto the wafers 200, which may result in a higher film forming rate. If the temperature of the wafers 200 exceeds 700 degrees C., a CVD reaction is strengthened (i.e., a gas phase reaction becomes dominant), which may result in deteriorated uniformity of film thickness and difficulty in control thereof. When the temperature of the wafers 200 is 700 degrees C. or lower, it is possible to suppress such deterioration of the uniformity of film thickness and avoid difficulty in control thereof. In particular, when the temperature of the wafers 200 is 650 degrees C. or lower, preferably 600 degrees C. or lower, a surface reaction becomes dominant, which facilitates secure of the uniformity of film thickness and control thereof. Thus, in some embodiments, the temperature of the wafers 200 will mainly fall within a range of 350 to 650 degrees C., preferably 350 to 600 degrees C.

The supply of the HCDS gas results in formation of a silicon-containing layer having a thickness of, for example, less than one atomic layer to several atomic layers on the wafers 200. The silicon-containing layer may be a HCDS gas adsorption layer or a silicon layer or both thereof. In this example, the silicon-containing layer may be a layer which contains silicon (Si) and chlorine (Cl). In this example, the silicon layer is the generic term including a continuous layer made of silicon (Si), a discontinuous layer, or a silicon thin film composed of a combination of these continuous and discontinuous layers. The continuous layer made of Si is sometimes referred to as a silicon thin film. Si of which the silicon layer is made includes one which is not completely decoupled from Cl. The HCDS gas adsorption layer includes a HCDS gas molecule continuous chemical adsorption layer and a HCDS gas molecule discontinuous chemical adsorption layer. That is, the HCDS gas chemical adsorption layer includes a chemical adsorption layer having a thickness of one molecular layer or less constituted by HCDS molecules. The HCDS ($Si_2Cl_6$) molecules constituting the HCDS gas chemical adsorption layer include those ($Si_xCl_y$ molecules) in which Si is partially decoupled from Cl. That is, the HCDS chemical adsorption layer includes $Si_2Cl_6$ molecule and/or $Si_xCl_y$ continuous and discontinuous chemical adsorption layers. As used herein, the phrase "layer having a thickness of less than one atomic layer" means an atomic layer discontinuously formed and the phrase "layer having a thickness of one atomic layer" means an atomic layer continuously formed. Similarly, the phrase "layer having a thickness of less than one molecular layer" means a molecular layer discontinuously formed and the phrase "layer having a thickness of one molecular layer" means a molecular layer continuously formed. Under the condition where the HCDS gas is self-decomposed (pyrolyzed), that is, under the condition where a pyrolytic reaction of the HCDS gas occurred, Si is deposited on the wafers 200, thereby forming the silicon layer. Under the condition where the HCDS gas is not self-decomposed (pyrolyzed), that is, under the condition where no pyrolytic reaction of the HCDS gas occurred, the HCDS gas is chemically adsorbed and deposited on the wafers 200, thereby forming the HCDS gas chemical adsorption layer. Forming the silicon layer on the wafers 200 can advantageously provide a higher film formation rate than forming the HCDS gas adsorption layer on the wafers 200. If the thickness of the silicon-containing layer formed on the wafers 200 exceeds several atomic layers, modification reaction in Steps 2 and 3, which will be described later, may not be applied to the entire silicon-containing layer. The minimum of thickness of the silicon-containing layer which can be formed on the wafers 200 is less than one atomic layer. Accordingly, the thickness of the silicon-containing layer may be set to fall within a range of less than one atomic layer to several atomic layers. When the thickness of the silicon-containing layer is not less than one atomic layer, i.e., one atomic layer or less, modification reaction in Steps 2 and 3, which will be described later, can be relatively expedited and time required for the modification reaction in Steps 2 and 3 can be shortened. Time required for the formation of the silicon-containing layer in Step 1 can be also shortened. As a result, processing time per cycle and hence total processing time can be shortened. In other words, a film formation rate can be increased. In addition, when the thickness of the silicon-containing layer is not less than one atomic layer, controllability for uniform film thickness can be improved.

<Residual Gas Removal>

After the silicon-containing layer is formed, the valve 243a of the first gas supply pipe 232a is closed to stop the supply of the HCDS gas. At this time, with the APC valve 244 of the exhaust pipe 231 opened, the interior of the process chamber 201 is vacuum-exhausted by the vacuum pump 246 and unreacted HCDS gas remaining in the process chamber 201 or HCDS gas which remains after contributing to the formation of the titanium-containing layer is excluded from the process chamber 201. At this time, with the valves 243e, 243f and 243g opened, the supply of the $N_2$ gas, as an inert gas, into the process chamber 201 is maintained. The $N_2$ gas acts as a purge gas which is capable of further improving the effect of excluding the unreacted HCDS gas remaining in the process chamber 201 or the HCDS gas which remains after contributing to the formation of the silicon-containing layer from the process chamber 201. The residual gas in the process chamber 201 may not be completely excluded and the interior of the process chamber 201 may not be completely purged. If an amount of the residual gas in the process chamber 201 is very small, this has no adverse effect on the subsequent Step 2. In this case, there is no need to provide a high flow rate of the $N_2$ gas supplied into the process chamber 201. For example, the same volume of the $N_2$ gas as the reaction tube 203 (the process chamber 201) may be supplied into the process chamber 201 to purge the interior of the process chamber 201 to such a degree that this has no adverse effect on Step 2. In this way, when the interior of the process chamber 201 is not completely purged, purge time can be shortened, thereby improving a throughput. This can also limit consumption of the $N_2$ gas to the minimum required for purging.

Examples of the chlorosilane-based precursor gas may include inorganic precursor gases such as a tetrachlorosilane or silicon tetrachloride ($SiCl_4$, STC) gas, a trichlorosilane ($SiHCl_3$ TCS) gas, a dichlorosilane ($SiH_2Cl_2$, DCS) gas, a monochlorosilane ($SiH_3Cl$, MCS) gas and the like, in addition to a hexachlorodisilane ($Si_2Cl_6$, HCDS) gas. Examples of the inert gas may include rare gases such as an Ar gas, a He gas, a Ne gas, a Xe gas and the like, in addition to the $N_2$ gas.

<Step 2>

<$SiH_3R$ Gas Supply>

After Step 1 is completed to remove the residual gas from the process chamber 201, the valve 243b of the second gas supply pipe 232b is opened to flow the $SiH_3R$ gas into the second gas supply pipe 232b. A flow rate of the $SiH_3R$ gas flowing into the second gas supply pipe 232b is regulated by the mass flow controller 241b. The $SiH_3R$ gas with its flow rate regulated is supplied from the gas supply holes 250b of the second nozzle 249b into the process chamber 201 and is exhausted from the exhaust pipe 231. At this time, the $SiH_3R$ gas is supplied for the wafers 200. At the same time, the valve 243f is opened to flow the $N_2$ gas as an inert gas into the second inert gas supply pipe 232f. A flow rate of the $N_2$ gas flowing into the second inert gas supply pipe 232f is regulated by the mass flow controller 241f. The $N_2$ gas with its flow rate regulated is supplied into the process chamber 201, along with the $SiH_3R$ gas, and is exhausted from the exhaust pipe 231. At this time, in order to prevent the $SiH_3R$ gas from being introduced into the first nozzle 249a and the third nozzle 249c, the valves 243e and 243g are opened to flow the $N_2$ gas into the first inert gas supply pipe 232e and the third inert gas supply pipe 232g. The $N_2$ gas is supplied into the process chamber 201 via the first gas supply pipe 232a, the third gas supply pipe 232c, the first nozzle 249a and the third nozzle 249c and is exhausted from the exhaust pipe 231.

At this time, the APC valve 244 is appropriately regulated to set the internal pressure of the process chamber 201 to fall within a range of, for example, 1 to 13300 Pa, preferably 20 to 1330 Pa. The flow rate of $SiH_3R$ gas controlled by the mass flow controller 241b is set to fall within a range of, for example, 1 to 1000 sccm. The flow rate of $N_2$ gas controlled by the mass flow controller 241f is set to fall within a range of, for example, 100 to 10000 sccm. The time period during which the $SiH_3R$ gas is supplied to the wafers 200, that is, gas supply time (irradiation time), is set to fall within a range of, for example, 1 to 120 seconds, preferably 1 to 60 seconds. At this time, the heater 207 is set to a temperature such that the temperature of the wafers 200 is set to fall within a range of, for example, 250 to 700 degrees C., preferably 350 to 650 degrees C., more preferably 350 to 600 degrees C., as in Step 1.

The supply of $SiH_3R$ gas results in reaction of the silicon-containing layer formed on the wafers 200 in Step 1 with the $SiH_3R$ gas. This reaction allows the silicon-containing layer to be changed (modified) to a first layer containing silicon (Si) and impurities such as chlorine (Cl) and the like. The first layer has a thickness ranging from less than one atom layer to several atom layers. The first layer is a silicon-rich layer with small content of impurities such as chlorine (Cl), carbon (C), nitrogen (N) and the like, that is, a silicon (Si) layer containing a small quantity of impurities such as Cl, C, N and the like. Cl contained in the silicon-containing layer and amino groups contained in the $SiH_3R$ gas upon forming the Si layer as the first layer mostly react to form a reaction product such as, for example, an amino salt or the like in the course of modification reaction of the silicon-containing layer by the $SiH_3R$ gas and are discharged out of the process chamber 201 via the exhaust pipe 231. This allows the amount of impurities such as Cl, C, N and the like contained in the first layer to be reduced. In addition, when the $SiH_3R$ gas is used as the aminosilane-based precursor gas, the amount of impurities such as C, N and the like contained in the first layer can be easily reduced and particularly the amount of N can be significantly reduced in that the amount of the amino groups included (in one molecule) in its composition formula is small, that is, the amount of C and N included in its composition is small.

<Residual Gas Removal>

Thereafter, the valve 243b of the second gas supply pipe 232b is closed to stop the supply of the SiH₃R gas. At this time, with the APC valve 244 of the exhaust pipe 231 opened, the interior of the process chamber 201 is vacuum-exhausted by the vacuum pump 246 and unreacted SiH₃R gas remaining in the process chamber 201 or SiH₃R gas which remains after contributing to the reaction, and reactive by-products are excluded from the process chamber 201. At this time, with the valves 243f, 243e and 243g opened, the supply of the N₂ gas as an inert gas into the process chamber 201 is maintained. The N₂ gas acts as a purge gas to exclude an unreacted SiH₃R gas which remains in the process chamber 201 after contributing to the formation of the first layer, and reactive by-products from the process chamber 201. At this time, the gas remaining in the process chamber 201 may not be completely excluded and the interior of the process chamber 201 may not be completely purged. If an amount of the gas remaining in the process chamber 201 is very small, this has no adverse effect on the subsequent Step 3. In this case, there is no need to provide a high flow rate of the N₂ gas supplied into the process chamber 201. For example, the same volume of the N₂ gas as the reaction tube 203 (the process chamber 201) may be supplied into the process chamber 201 to purge the interior of the process chamber 201 to such a degree that this has no adverse effect on Step 3. In this way, when the interior of the process chamber 201 is not completely purged, purge time can be shortened, thereby improving a throughput. This can also limit consumption of the N₂ gas to the minimum required for purging.

Examples of the aminosilane-based precursor may include a diaminosilane (SiH₂RR'), a triaminosilane (SiHRR'R"), tetraaminosilane (SiRR'R"R''') and the like, in addition to the monoaminosilane (SiH₃R). Here, R, R', R" and R''' represent ligands. In this example, R, R', R" and R''' are amino groups in which one or two hydrocarbon groups containing one or more carbon elements (C) are coordinated with one nitrogen element (N) (i.e., one or both of hydrogen elements (H) of an amino group represented by NH₂ are substituted by a hydrocarbon group containing one or more carbon elements (C)). If two hydrocarbon groups constituting a portion of the amino groups are coordinated with one nitrogen element (N), the two hydrocarbon groups may be the same or different from each other. In addition, the hydrocarbon groups may include an unsaturated bond such as a double bond or a triple bond. In addition, R, R', R" and R''' may be the same amino group or different amino groups. In addition, the amino group may have a ring structure. Examples of SiH₂RR' may include a bis(diethylamino)silane (SiH₂[N(C₂H₅)₂]₂, BDEAS), a bis(tertiarybutylamino)silane (SiH₂[NH(C₄H₉)]₂, BTBAS), a bis(diethylpiperidino)silane(SiH₂[NC₅H₈)(C₂H₅)₂]₂) and the like. Examples of SiHRR'R" may include a tris(diethylamino)silane (SiH[N(C₂H₅)₂]₃, 3DEAS), a tris(dimethylamino)silane (SiH[N(CH₃)₂]₃, 3DMAS) and the like. Examples of SiRR'R"R''' may include a tetrakis(diethylamino)silane (Si[N(C₂H₅)₂]₄, 4DEAS), a tetrakis(dimethylamino)silane (Si[N(CH₃)₂]₄, 4DMAS) and the like. Examples of the inert gas may include rare gases such as an Ar gas, a He gas, a Ne gas, a Xe gas and the like, in addition to the N₂ gas.

<Step 3>
<H₂ Gas Supply>

After Step 2 is completed to remove the residual gas from the process chamber 201, the valve 243c of the third gas supply pipe 232c is opened to flow the H₂ gas into the third gas supply pipe 232c. A flow rate of the H₂ gas flowing into the third gas supply pipe 232c is regulated by the mass flow controller 241c. The H₂ gas with its flow rate regulated is supplied from the gas supply hole 250c of the third nozzle 249c into the process chamber 201. The H₂ gas supplied into the process chamber 201 is activated by heat and is exhausted from the exhaust pipe 231. At this time, the H₂ gas activated by heat is supplied to the wafers 200. At the same time, the valve 243g is opened to flow the N₂ gas into the third inert gas supply pipe 232g. The N₂ gas is supplied into the process chamber 201, along with the H₂ gas, and is exhausted from the exhaust pipe 231. At this time, in order to prevent the H₂ gas from being introduced into the first nozzle 249a and the second nozzle 249b, the valves 243e and 243f are opened to flow the N₂ gas into the first inert gas supply pipe 232e and the second inert gas supply pipe 232f. The N₂ gas is supplied into the process chamber 201 via the first gas supply pipe 232a, the second gas supply pipe 232b, the first nozzle 249a and the second nozzle 249b and is exhausted from the exhaust pipe 231.

At this time, the APC valve 244 is appropriately regulated to set the internal pressure of the process chamber 201 to fall within a range of, for example, 1 to 3000 Pa. When the internal pressure of the process chamber 201 is set to such a relatively high range of pressure, the H₂ gas can be thermally activated by non-plasma. Such thermal activation of the H₂ gas may cause a soft reaction which may result in soft modification (reducing process) which will be described later. The flow rate of H₂ gas controlled by the mass flow controller 241c is set to fall within a range of, for example, 100 to 10000 sccm. The flow rates of N₂ gases controlled by the mass flow controllers 241g, 241e and 241f are set to fall within a range of, for example, 100 to 10000 sccm. A partial pressure of the H₂ gas in the process chamber 201 is set to fall within a range of, for example, 0.01 to 2970 Pa. The time period during which the thermally-activated H₂ gas is supplied to the wafers 200, that is, gas supply time (irradiation time), is set to fall within a range of, for example, 1 to 120 seconds, preferably 1 to 60 seconds. At this time, the heater 207 is set to a temperature such that the temperature of the wafers 200 is set to fall within a range of, for example, 250 to 700 degrees C., preferably 350 to 650 degrees C., more preferably 350 to 600 degree C., as in Steps 1 and 2.

At this time, a gas flown in the process chamber 201 is only the H₂ gas thermally activated by the high internal pressure of the process chamber 201. The HCDS gas and the SiH₃R gas are not flown in the process chamber 201. Therefore, the activated H₂ gas reacts with the first layer formed on the wafers 200 in Step 2, without causing any gaseous reaction. This allows impurities such as Cl and the like slightly contained in the first layer to be separated from the first layer, thereby changing (modifying) the first layer into a second layer (Si layer) with the very low content of impurities such as Cl, C, N and the like. At this time, it may be contemplated that C and N contained in the first layer are separated from the first layer by the action of the H₂ gas although Cl contained in the first layer is mainly separated from the first layer. As described above, although it has the low content of impurities such as Cl, C, N and the like, the first layer formed in Step 2 can be modified into the second layer having the very low content of impurities such as Cl, C, N and the like (a Si layer having a higher purity) by supplying the H₂ gas to the first layer to separate the impurities such as Cl and the like from the first layer. In addition, when H₂ gas or the like which contains no Cl, C and N is used as a reducing agent, the amount of impurities such as Cl, C, N and the like contained in the second layer can be easily reduced in that the impurities such as Cl, C, N and the like can be prevented from being added in the second layer.

<Residual Gas Removal>

Thereafter, the valve 243c of the third gas supply pipe 232c is closed to stop the supply of the $H_2$ gas. At this time, with the APC valve 244 of the exhaust pipe 231 opened, the interior of the process chamber 201 is vacuum-exhausted by the vacuum pump 246 and unreacted $H_2$ gas remaining in the process chamber 201 (or the $H_2$ gas which remains after contributing to the reaction) and reaction byproducts are excluded from the process chamber 201. At this time, with the valves 243g, 243e and 243f opened, the supply of the $N_2$ gas into the process chamber 201 is maintained. The $N_2$ gas acts as purge gas which is capable of improving the effect of excluding the unreacted $H_2$ gas remaining in the process chamber 201 (or the $H_2$ gas which remains after contributing to the formation of the second layer) and the reaction byproducts from the process chamber 201. The residual gas in the process chamber 201 may not be completely excluded and the interior of the process chamber 201 may not be completely purged. If the amount of the residual gas in the process chamber 201 is very small, this has no adverse effect on the subsequent Step 1. In this case, there is no need to provide a high flow rate of the $N_2$ gas supplied into the process chamber 201. For example, the same volume of the $N_2$ gas as the reaction tube 203 (the process chamber 201) may be supplied into the process chamber 201 to purge the interior of the process chamber 201 to such a degree that this has no adverse effect on Step 1. In this way, when the interior of the process chamber 201 is not completely purged, purge time can be shortened, thereby improving a throughput. This can also limit consumption of the $N_2$ gas to the minimum required for purging.

Examples of the hydrogen-containing gas may include a monosilane ($SiH_4$) gas and a polysilane ($Si_nH_{2n+2}$(n>2)) such as a disilane ($Si_2H_6$) gas, a trisilane ($Si_3H_8$) gas and the like, in addition to the $H_2$ gas. Examples of the inert gas may include rare gases such as an Ar gas, a He gas, a Ne gas, a Xe gas and the like, in addition to the $N_2$ gas.

When a cycle including the above-described Steps 1 to 3 is performed once or more (predetermined number of times), a silicon (Si) film having a predetermined thickness with the very low content of impurities such as chlorine (Cl), carbon (C), nitrogen (N) and the like can be formed on the wafers 200. This cycle may be preferably performed several times rather than once. That is, a thickness of the Si layer formed per cycle may be set to be smaller than a desired thickness and the cycle may be repeated several times until the Si layer reaches the desired thickness.

<Purge and Return to Atmospheric Pressure>

Once the film formation process of forming the Si film having the predetermined thickness is completed, the valves 243e, 243f and 243g are opened and $N_2$ gases as inert gases are supplied from the respective first inert gas supply pipe 232e, second inert gas supply pipe 232f, and third inert gas supply pipe 232g into the process chamber 201 and are exhausted from the exhaust pipe 231 such that the interior of the process chamber 201 is purged by the inert gases (gas purge), thereby removing gas remaining in the process chamber 201 and reaction byproducts from the process chamber 201. Thereafter, the internal atmosphere of the process chamber 201 is substituted with the inert gas (inert gas substitution) and the internal pressure of the process chamber 201 returns to the atmospheric pressure (return to atmospheric pressure).

<Boat Unload and Wafer Discharge>

Thereafter, the seal cap 219 is descended by the boat elevator 115 to open the bottom of the reaction tube 203 while carrying the processed wafers 200 from the bottom of the reaction tube 203 out of the reaction tube 203 with them supported by the boat 217 (boat unload). Thereafter, the processed wafers 200 are discharged out of the boat 217 (wafer discharge).

<Second Sequence>

Figure 5:
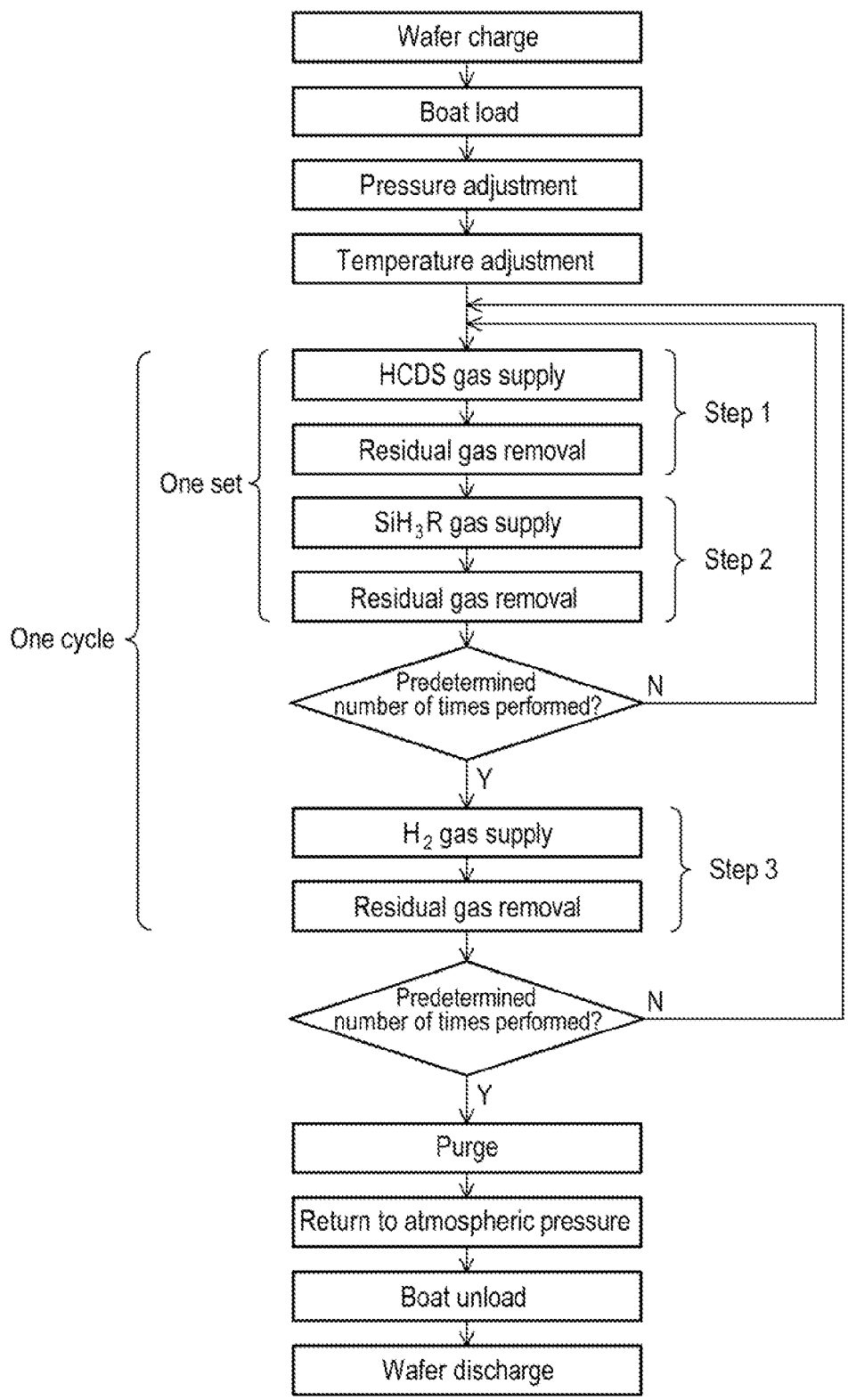
FIG. 5 is a flow chart illustrating film formation in a second sequence, according to some embodiments.

Next, a second sequence of this embodiment will be described. FIG. 5 is a flow chart illustrating film formation in a second sequence of this embodiment. FIG. 7 is a timing diagram illustrating timing of gas being supplied in the second sequence of this embodiment.

In the second sequence of this embodiment, by performing a set of a process of supplying a chlorosilane-based precursor as a first precursor to the wafer 200 in the process chamber 201 and supplying an aminosilane-based precursor as a second precursor to the wafer 200 in the process chamber 201 several times, a first layer containing impurities such as silicon, chlorine and the like is formed on the wafer 200 A cycle including forming the first layer and forming a second layer containing silicon (silicon layer) by supplying a reducing agent containing no chlorine, nitrogen and carbon to the wafer 200 in the process chamber 201 to modifying the first layer so that the impurities such as chlorine contained in the first layer are separated from the first layer is performed by a predetermined number of times (once or more) to form a silicon film constituted by silicon alone on the wafer 200.

FIGS. 5 and 7 show an example in which the act of supplying a chlorosilane-based precursor to the wafer 200 in the process chamber 201 and the act of supplying an aminosilane-based precursor are alternately performed several times to form the first layer, i.e., the chlorosilane-based precursor is supplied earlier than the aminosilane-based precursor.

Specifically, in this film forming second sequence, one cycle including the act of repeating a set of Steps 1 and 2 in the above-described first sequence several times and the act of performing Step 3 is performed a predetermined number of times to form a silicon film on the wafer 200. FIG. 7 shows an example in which one cycle including the act of performing a set of Steps 1 and 2 twice and the act of performing Step 3 is performed n times to form a Si film having a predetermined thickness on the wafer 200. This second sequence is the same as the first sequence except that Step 3 is performed after repeating the set of Steps 1 and 2 several times. In addition, this second sequence may have the same process conditions as the first sequence.

(3) Certain Advantages

According to the first and second sequences of the embodiment, in Step 2, by reacting the silicon-containing layer with the $SiH_3R$ gas, the silicon-containing layer is modified into the first layer (Si layer)) having the low content of impurities such as Cl, C, N and the like. In addition, in Step 3, by reacting the first layer with the activated $H_2$ gas, the impurities such as Cl and the like are separated from the first layer to modify the first layer into the second layer having the very low content of impurities such as Cl, C, N and the like (a Si layer having a higher purity). Accordingly, by performing a cycle of Steps 1 to 3 a predetermined number of times or performing a cycle including the act of performing one set of Steps 1 to 2 and repeating it by a predetermined number of times and the act of performing Step 3 by a predetermined number of times, a high quality silicon film having the very small content of impurities such as Cl, C, N and the like can be formed at a range of low temperatures. In addition, the silicon film formed by this film forming method becomes a compact film having a high wet etching resistance to, for example, HF and the like and can be suitable to be used as a film for an etching mask or the like, for example when HF is used to etch an underlying SiO film or the like. In this case, however, since the silicon film is not an insulating film such as a SiO film or a SiN film, it needs to be removed after it is used as, for example, a film for an etching mask.

In addition, according to the first and second sequences of the embodiment, in Step 2, the $SiH_3R$ gas having the low content of amino groups contained (in one molecule) in its composition formula is used as the aminosilane-based precursor gas. Specifically, a precursor gas containing a single amino group (in one molecule) in its composition is used. In this way, when a precursor gas having a small amount of C and N contained in its composition is used as the aminosilane-based precursor gas, the amount of impurities such as C, N and the like contained in the first layer formed in Step 2 can be easily reduced and particularly the amount of N can be significantly reduced. In addition, the amount of impurities such as C, N and the like contained in the formed silicon film can be easily reduced and particularly the amount of N can be significantly reduced.

In addition, according to the first and second sequences of the embodiment, in Step 3, the $H_2$ gas containing no Cl, N and C is used as a reducing agent. This allows for prevention of impurities such as Cl, C, N and the like from being added in the second layer. As a result, the amount of impurities such as Cl, C, N and the like contained in the second layer can be easily reduced and the amount of impurities such as Cl, C, N and the like contained in the formed silicon film can be easily reduced.

In addition, according to the first and second sequences of the embodiment, a silicon film can be formed even at a range of low temperatures by using two precursors (silane sources), i.e., the chlorosilane-based precursor and the aminosilane-based precursor. Experiments by the inventors showed that the use of chlorosilane-based precursor alone resulted in difficulty in depositing silicon on a wafer at a film forming rate to satisfy production efficiency at a range of temperature of 500 degrees C. or less. In these experiments, no deposition of silicon on a wafer at a range of temperature of 500 degrees C. or less has been identified. However, according to the method of this embodiment, it is possible to form a high quality silicon film at a film forming rate to satisfy production efficiency even at a range of low temperatures of 500 degrees C. or less, for example, a range of 350 to 500 degrees C.

When a film formation temperature is made low, kinetic energy of molecules is typically lowered such that chlorine contained in the chlorosilane-based precursor and amine contained in the aminosilane-based precursor are hard to react or be separated and their ligands remain on the surface of the wafer. These residual ligands provide steric hindrances which hinder silicon from being adsorbed on the surface of the wafer and decrease the density of silicon, thereby causing film deterioration. However, even under conditions of difficulty of such reaction and separation, two silane sources, i.e., the chlorosilane-based precursor and the aminosilane-based precursor, can appropriately react with each other to allow for the separation of their residual ligands. The separation of their residual ligands eliminates the steric hindrances to allow for adsorption of silicon on opened sites, which results in increase in the silicon density. In this way, it is believed that a film having a high silicon density can be formed even at a range of low temperatures of 500 degrees C. or less.

<Other Embodiments>

Although various embodiments have been described in the above, the present disclosure is not limited to these disclosed embodiments and various modifications and changes may be made without departing from the spirit and scope of the present disclosure.

Although an example of supplying the chlorosilane-based precursor and then aminosilane-based precursor to the wafers 200 in the process chamber 201 when the first layer is formed in each sequence has been illustrated in the above embodiments, a sequence of supply of these precursors may be reversed. That is, the aminosilane-based precursor may be first supplied and the chlorosilane-based precursor may be then supplied. In other words, one of the chlorosilane-based precursor and the aminosilane-based precursor is first supplied and the other may be then supplied. Changing the sequence of precursor supply in this way allows change in quality of a film formed in each sequence.

In addition to the sequence of precursor supply of the chlorosilane-based precursor and the aminosilane-based precursor, a sequence of supply of all gases including the chlorosilane-based precursor and the aminosilane-based precursor may be altered to change the quality of a film formed in each sequence.

In addition, although an example of using the chlorosilane-based precursor and the aminosilane-based precursor to form the first layer in each sequence has been illustrated in the above embodiments, the chlorosilane-based precursor may be replaced with other silane-based precursor having halogen-based ligands. For example, the chlorosilane-based precursor may be replaced with fluorosilane-based precursor. Here, the fluorosilane-based precursor refers to the silane-based precursor which has fluoro groups as halogen groups and contains at least a silicon (Si) element and a fluorine (F) element. Examples of the fluorosilane-based precursor gas may include a silicon fluoride gas such as a tetrafluorosilane (or silicon tetrafluoride ($SiF_4$)) gas, a hexafluorosilane ($Si_2F_6$) gas and the like. In this case, the fluorosilane-based precursor and the aminosilane-based precursor are supplied to the wafers 200 in the process chamber 201 in this order or vice versa to form the first layer in each sequence. But, from a relation with a vapor pressure of reaction products generated in Step 2, it is preferable to use the chlorosilane-based precursor as the silane-based precursor having halogen groups.

In addition, although an example of using the monoaminosilane ($SiH_3R$) as the second precursor (aminosilane-based precursor) has been illustrated in the above embodiments, the present disclosure is not limited thereto. For example, other organic precursors such as diaminosilane ($SiH_2RR'$), triaminosilane ($SiHRR'R''$), tetraaminosilane ($SiHRR'R''R'''$) and the like may be used as the second precursor. That is, precursors containing two, three or four amino groups (in one molecule) in their composition formula may be used as the second precursor. In this way, even when a precursor containing one or more amino groups (in one molecule) in its composition formula is used, it is possible to form a silicon film having the low content of impurities such as carbon (C), nitrogen (N) and the like at a range of low temperatures.

However, the fewer number of amino groups contained in the composition formula of the second precursor, that is, the lower amount of carbon (C) or nitrogen (N) contained in the composition, is more likely to reduce the amount of impurities such as carbon (C), nitrogen (N) and the like contained in the first layer and form a silicon film having the very low content of impurities. In other words, it is preferable to use $SiH_3R$, $SiH_2RR'$ or $SiHRR'R''$ rather than $SiHRR'R''R'''$ as the second precursor since it is likely to reduce the amount of impurities contained in the silicon film. In addition, it is more preferable to use $SiH_3R$ or $SiH_2RR'$ rather than as the second precursor since it is more likely to reduce the amount of impurities contained in the silicon film. In addition, it is even more preferable to use $SiH_3R$ rather than $SiH_2RR'$ as the second precursor since it is even more likely to reduce the amount of impurities contained in the silicon film.

In addition, although an example of using the $H_2$ gas as a reducing agent has been illustrated in the above embodiments, the present disclosure is not limited thereto. For example, a $SiH_4$ gas or a polysilane gas such as a $Si_2H_6$ gas, a $Si_3H_8$ gas or the like may be used as the reducing agent. If the $SiH_4$ gas is used as the reducing agent, the fourth gas supply system is used instead of the third gas supply system. In this case, in Step 3, instead of opening the valve 243c of the third gas supply pipe 232c, the valve 243d of the fourth gas supply pipe 232d is opened to flow the $SiH_4$ gas into the fourth gas supply pipe 232d and supply the $SiH_4$ gas with its flow rate regulated by the mass flow controller 241d from the gas supply holes 250c into the process chamber 201. Even when the SiH4 gas or the polysilane gas is used as the reducing agent, it is possible to form a high quality silicon film having the very low content of impurities such as Cl, C, N and the like.

In addition, when the silicon film formed by the methods above is used as an etch stopper, it is possible to provide a device formation technique having excellent processability. In addition, the silicon film formed by the methods of the above embodiments is adaptable to a wide range of applications including the formation of floating gate electrodes and control gate electrodes of a flash memory, channel silicon of a 3D NAND type flash memory, gate electrodes of a transistor, capacitor electrodes of DRAM, a STI liner, a solar cell and so on.

In addition, although an example of forming the silicon (Si) film containing a semiconductor element such as silicon as a film containing a certain element has been illustrated in the above embodiments, the spirit of the present disclosure can be applied to formation of a metal-based film containing a metal element such as titanium (Ti), zirconium (Zr), hafnium (Hf), tantalum (Ta), aluminum (Al), molybdenum (Mo) or the like.

In this case, a precursor containing a metal element and a halogen group (first precursor) may be replaced for the chlorosilane-based precursor in the above embodiments and a precursor containing a metal element and an amino group (second precursor) may be replaced for the aminosilane-based precursor to form a film according to the same film formation sequence as the above embodiments. Examples of the first precursor may include a precursor containing a metal element and a chloro group and a precursor containing a metal element and a fluoro group.

That is, in this case, by performing a cycle including supplying the first precursor containing the metal element and the halogen group to the wafer 200 in the process chamber 201, supplying the second precursor containing the metal element and the amino group to the wafer 200 in the process chamber 201 and supplying a reducing agent not containing halogen, nitrogen and carbon to the wafer 200 in the process chamber 201 by a predetermined number of times, a metal element film constituted by a metal element alone (i.e., metal film) is formed as a metal-based film containing a metal element on the wafer 200.

For example, if a Ti film as a Ti-based film constituted by Ti alone is to be formed as a metal-based film, examples of the first precursor may include a precursor containing Ti and a chloro group, such as titanium tetrachloride ($TiCl_4$) and a precursor containing Ti and a fluoro group, such as titanium tetrafluoride ($TiF_4$). Examples of the second precursor may include a precursor containing Ti and an amino group, such as tetrakis(ethylmethylamino)titanium ($Ti[N(C_2H_5)(CH_3)]_4$, TEMAT), tetrakis(dimethylamino)titanium ($Ti[N(CH_3)_2]_4$, TDMAT), tetrakis(diethylamino)titanium ($Ti[N(C_2H_5)_2]_4$, TDEAT) or the like. A reducing agent used here may be the same as in the above embodiments. In addition, process conditions used here may be the same as in the above embodiments.

As another example, if a Zr film as a Zr-based film constituted by Zr alone is to be formed as a metal-based film, examples of the first precursor may include a precursor containing Zr and a chloro group, such as zirconium tetrachloride ($ZrCl_4$) and a precursor containing Zr and a fluoro group, such as zirconium tetrafluoride ($ZrF_4$). Examples of the second precursor may include a precursor containing Zr and an amino group, such as tetrakis(ethylmethylamino)zirconium ($Zr[N(C_2H_5)(CH_3)]_4$, TEMAZ), tetrakis(dimethylamino)zirconium ($Zr[N(CH_3)_2]_4$, TDMAZ), tetrakis(diethylamino)zirconium ($Zr[N(C_2H_5)_2]_4$, TDEAZ) or the like. A reducing agent used here may be the same as in the above embodiments. In addition, process conditions used here may be the same as in the above embodiments.

As another example, if a Hf film as a Ti-based film constituted by Hf alone is to be formed as a metal-based film, examples of the first precursor may include a precursor containing Hf and a chloro group, such as hafnium hafnium tetrachloride ($HfCl_4$) and a precursor containing Hf and a fluoro group, such as hafnium tetrafluoride ($HfF_4$). Examples of the second precursor may include a precursor containing Hf and an amino group, such as tetrakis(ethylmethylamino)hafnium ($Hf[N(C_2H_5)(CH_3)]_4$, TEMAH), tetrakis(dimethylamino)hafnium ($Hf[N(CH_3)_2]_4$, TDMAH), tetrakis(diethylamino)hafnium ($Hf[N(C_2H_5)_2]_4$, TDEAH) or the like. A reducing agent used here may be the same as in the above embodiments. In addition, process conditions used here may be the same as in the above embodiments.

In this manner, the present disclosure can be applied to the formation of the metal-based film, in addition to the silicon-based film, while obtaining the same operation and effects as in the above embodiments.

In brief, the present disclosure may be suitably applied to a case where films containing predetermined elements such as semiconductor elements, metal elements and the like are formed.

In addition, although the example of forming the films using the batch type substrate processing apparatus to process a plurality of substrates at once has been described in the above embodiments, the present disclosure is not limited thereto but may be suitably applied to film formation using a single type substrate processing apparatus to process a single substrate or several substrates at once.

In addition, the above embodiments, modifications and applications may be used in proper combinations.

In addition, the present disclosure may be implemented by changing the process recipes of an existing substrate processing apparatus, for example. The change of process recipes may include installing the process recipes of the present disclosure in the existing substrate processing apparatus via a telecommunication line or a recording medium storing the process recipes, and operating the existing substrate processing apparatus to change its process recipes into the process recipes of one or more of the embodiments described.

<Example>

The substrate processing apparatus in the above embodiments was used to form a silicon film on a wafer according to the first sequence shown in FIGS. 4 and 6. A HCDS gas, a $SiH_3R$ gas and a $H_2$ gas were used as a chlorosilane-based precursor gas (first precursor), a aminosilane-based precursor gas and a hydrogen-containing gas (reducing agent), respectively. The wafer temperature for film formation was set to 450 degrees C. Other process conditions were set to fall within a range of the process conditions described in the above embodiments. Concentrations of Cl, O, C and N contained in the formed silicon film (impurity concentration) were measured using HR-RBS (High Resolution Rutherford Back scattering Spectroscopy).

The results of the measurement showed that the concentrations of Cl, O, C and N contained in the silicon film formed in the above embodiments are 2.3% or less, 1.5% or less, 1.9% or less and less than a detection lower limit, respectively. The measured O is believed to be accommodated in a surface of the silicon film as the silicon film is exposed to the air when the wafer is carried out of a process chamber, instead of being accommodated in the film during the formation of the silicon film. That is, according to the first sequence shown in FIGS. 4 and 6, it has proved that a silicon film having the very low content of impurities such as Cl, O, C, N and the like can be formed at a range of low temperatures.

<Additional Aspects of Present Disclosure>

Hereinafter, some aspects of the present disclosure will be additionally stated.

A first aspect of the present disclosure may provide a method of manufacturing a semiconductor device, including: forming a film containing a predetermined element on a substrate in a process chamber by performing a cycle a predetermined number of times, the cycle including: supplying a first precursor containing the predetermined element and a halogen group to the substrate; supplying a second precursor containing the predetermined element and an amino group to the substrate; and supplying a reducing agent not containing halogen, nitrogen and carbon to the substrate.

In some embodiments, the forming a film containing a predetermined element includes: forming a first layer containing the predetermined element on the substrate by performing the act of supplying the first precursor and the act of supplying the second precursor; and forming a second layer containing the predetermined element by supplying the reducing agent to modify the first layer.

In some embodiments, the forming a film containing a predetermined element includes: forming a first layer containing the predetermined element and halogen on the substrate by performing the act of supplying the first precursor and the act of supplying the second precursor; and forming a second layer containing the predetermined element by supplying the reducing agent to modify the first layer so that the halogen contained in the first layer is separated.

In some embodiments, the forming a film containing a predetermined element includes: forming a first layer containing the predetermined element on the substrate by alternately performing the act of supplying the first precursor and the act of supplying the second precursor by a predetermined number of times; and forming a second layer containing the predetermined element by supplying the reducing agent to modify the first layer.

In some embodiments, the forming a film containing a predetermined element includes: forming a first layer containing the predetermined element and halogen on the substrate by alternately performing the act of supplying the first precursor and the act of supplying the second precursor by a predetermined number of times; and forming a second layer containing the predetermined element by supplying the reducing agent to modify the first layer so that the halogen contained in the first layer is separated.

In some embodiments, the forming a film containing a predetermined element includes: forming a first layer containing the predetermined element on the substrate by performing a set of the act of supplying the first precursor and the act of supplying the second precursor by a predetermined number of times; and forming a second layer containing the predetermined element by supplying the reducing agent to modify the first layer.

In some embodiments, the forming a film containing a predetermined element includes: forming a first layer containing the predetermined element and halogen on the substrate by performing a set of the act of supplying the first precursor and the act of supplying the second precursor by a predetermined number of times; and forming a second layer containing the predetermined element by supplying the reducing agent to modify the first layer so that the halogen contained in the first layer is separated.

Another aspect of the present disclosure may provide a method of manufacturing a semiconductor device, including: forming a film containing a predetermined element on a substrate in a process chamber by performing a cycle a predetermined number of times, the cycle including: forming a first layer containing the predetermined element on the substrate by performing a process of supplying one of a first precursor containing the predetermined element and a halogen group and a second precursor containing the predetermined element and an amino group to the substrate and supplying the other of the first and second precursors to the substrate, by a predetermined number of times; and forming a second layer containing the predetermined element by supplying a reducing agent not containing halogen, nitrogen and carbon to the substrate to modify the first layer.

In some embodiments, the second precursor contains one or more amino groups (in one molecule) its composition formula.

In some embodiments, the second precursor contains one amino group (in one molecule) in its composition formula.

In some embodiments, the film containing the predetermined element is a predetermined element film constituted by the predetermined element alone.

In some embodiments, the predetermined element includes a semiconductor element or a metal element.

In some embodiments, the predetermined element includes a silicon element.

Another aspect of the present disclosure may provide a method of manufacturing a semiconductor device, including: forming a silicon film on a substrate in a process chamber by performing a cycle a predetermined number of times, the cycle including: supplying a first precursor containing silicon and a halogen group to the substrate; supplying a second precursor containing the silicon and an amino group to the substrate; and supplying a reducing agent not containing halogen, nitrogen and carbon to the substrate.

Another aspect of the present disclosure may provide a method of processing a substrate, including: forming a film containing a predetermined element on a substrate in a process chamber by performing a cycle a predetermined number of times, the cycle including: supplying a first precursor containing the predetermined element and a halogen group to the substrate; supplying a second precursor containing the predetermined element and an amino group to the substrate; and supplying a reducing agent not containing halogen, nitrogen and carbon to the substrate.

Another aspect of the present disclosure may provide a substrate processing apparatus including: a process chamber configured to accommodate a substrate; a first precursor supply system configured to supply a first precursor containing a predetermined element and a halogen group to the substrate in the process chamber; a second precursor supply system configured to supply a second precursor containing the predetermined element and an amino group to the substrate in the process chamber; a reducing agent supply system configured to supply a reducing agent not containing halogen, nitrogen and carbon to the substrate in the process chamber; and a controller configured to control the first precursor supply system, the second precursor supply system and the reducing agent supply system to form a film containing the predetermined element on the substrate in the process chamber by performing a cycle a predetermined number of times, the cycle including: supplying the first precursor to the substrate; supplying the second precursor to the substrate; and supplying the reducing agent to the substrate.

Another aspect of the present disclosure may provide a program that causes a computer to perform a method including: forming a film containing a predetermined element on a substrate in a process chamber by performing a cycle a predetermined number of times, the cycle including: supplying a first precursor containing the predetermined element and a halogen group to the substrate; supplying a second precursor containing the predetermined element and an amino group to the substrate; and supplying a reducing agent not containing halogen, nitrogen and carbon to the substrate.

Another aspect of the present disclosure may provide a non-transitory computer-readable recording medium storing a program that causes a computer to perform a method including: forming a film containing a predetermined element on a substrate in a process chamber by performing a cycle a predetermined number of times, the cycle including: supplying a first precursor containing the predetermined element and a halogen group to the substrate; supplying a second precursor containing the predetermined element and an amino group to the substrate; and supplying a reducing agent not containing halogen, nitrogen and carbon to the substrate.

According to the present disclosure in some embodiments, it is possible to provide a semiconductor device manufacturing method, a substrate processing method, a substrate processing apparatus and a computer-readable recording medium storing instructions for executing such methods, which are capable of forming a film containing a certain element, such as a silicon film, at a range of low temperatures.

While certain embodiments have been described, these embodiments have been presented by way of example only, and are not intended to limit the scope of the disclosure. Indeed, the novel methods and apparatuses described herein may be embodied in a variety of other forms; furthermore, various omissions, combinations, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of manufacturing a semiconductor device, comprising:
    forming a film consisting of a predetermined element on a substrate by performing a cycle a predetermined number of times, the cycle including:
    supplying a first precursor containing the predetermined element and a halogen group to the substrate;
    supplying a second precursor containing the predetermined element and an amino group to the substrate; and
    supplying a reducing agent not containing halogen, nitrogen and carbon to the substrate,
    wherein the act of forming the film consisting of the predetermined element includes:
    forming a first layer containing the predetermined element on the substrate by performing the act of supplying the first precursor and the act of supplying the second precursor, wherein the halogen group of the first precursor and the amino group of the second precursor react to form a reaction product to be removed from the first layer; and
    forming a second layer consisting of the predetermined element on the substrate by supplying the reducing agent to modify the first layer.

2. The method of claim 1, wherein
the first layer contains the predetermined element and halogen on the substrate during the act of forming the first layer, and
the halogen contained in the first layer is separated during the act of forming the second layer.

3. The method of claim 1, wherein
the first layer containing the predetermined element is formed on the substrate by alternately performing the act of supplying the first precursor and the act of supplying the second precursor by a predetermined number of times during the act of forming the first layer.

4. The method of claim 3, wherein
the first layer containing the predetermined element and halogen is formed on the substrate by alternately performing the act of supplying the first precursor and the act of supplying the second precursor by a predetermined number of times during the act of forming the first layer.

5. The method of claim 1, wherein
the first layer containing the predetermined element is formed on the substrate by performing a set of the act of supplying the first precursor and the act of supplying the second precursor by a predetermined number of times during the act of forming the first layer.

6. The method of claim 3, wherein
the first layer containing the predetermined element and halogen is formed on the substrate by performing a set of the act of supplying the first precursor and the act of supplying the second precursor by a predetermined number of times during the act of forming the first layer.

7. The method of claim 1, wherein the second precursor contains one or more amino groups in one molecule thereof.

8. The method of claim 1, wherein the second precursor contains one amino group in one molecule thereof.

9. The method of claim 1, wherein the predetermined element includes a semiconductor element or a metal element.

10. The method of claim 1, wherein the predetermined element includes silicon.

11. A method of processing a substrate, comprising:
    forming a film consisting of a predetermined element on a substrate by performing a cycle a predetermined number of times, the cycle including:
    supplying a first precursor containing the predetermined element and a halogen group to the substrate;
    supplying a second precursor containing the predetermined element and an amino group to the substrate; and
    supplying a reducing agent not containing halogen, nitrogen and carbon to the substrate,
    wherein the act of forming the film consisting of the predetermined element includes:
    forming a first layer containing the predetermined element on the substrate by performing the act of supplying the first precursor and the act of supplying the second precursor, wherein the halogen group of the first precursor and the amino group of the second precursor react to form a reaction product to be removed from the first layer; and
    forming a second layer consisting of the predetermined element on the substrate by supplying the reducing agent to modify the first layer.

* * * * *